United States Patent [19]

Nagai et al.

[11] Patent Number: 5,448,088
[45] Date of Patent: Sep. 5, 1995

[54] SEMICONDUCTOR INTEGRATED CIRCUIT HAVING LENGTHENED CONNECTION PINS FOR CONNECTION TO EXTERNAL WIRINGS

[75] Inventors: Takao Nagai; Koichi Kaneko; Hiroaki Shinagawa; Masao Yoshinaga, all of Itami, Japan

[73] Assignees: Mitsubishi Electric Engineering Company Limited; Mitsubishi Denki Kabushiki Kaisha, both of Tokyo, Japan

[21] Appl. No.: 258,230

[22] Filed: Jun. 10, 1994

[30] Foreign Application Priority Data

Jul. 1, 1993 [JP] Japan ................................. 5-163525

[51] Int. Cl.⁶ ..................... H01L 27/10; H01L 27/15
[52] U.S. Cl. ..................... 257/208; 257/210
[58] Field of Search ............... 257/202, 204, 206, 208, 257/210, 211, 692

[56] References Cited

FOREIGN PATENT DOCUMENTS 4-42571   2/1992  Japan ............................. 257/208
4-287369 10/1992 Japan ............................. 257/202

Primary Examiner—Jerome Jackson
Assistant Examiner—Donald L. Monin, Jr.
Attorney, Agent, or Firm—Oblon, Spivak, McClelland, Maier, & Neustadt

[57] ABSTRACT

An object of the present invention is to obtain a gate array type semiconductor integrated circuit device in which wiring restrictions upon separate basic cells are relaxed so as to relatively easily provide wirings among the basic cells. A gate array type semiconductor integrated circuit is configured in the conditions that a lateral length of each of connection pins (25) of basic cells (1) is determined as one-wiring pitch (W1) and that a distance between the connection pins (25) of adjacent ones of the basic cells in any of cell alignments (3) is determined as the one-wiring pitch (W1). Since two or more longitudinal wirings can be formed extending from each of the connection pins of the basic cells in a second direction, the wirings among the basic cells can be provided relatively easily.

12 Claims, 23 Drawing Sheets

SEMICONDUCTOR INTEGRATED CIRCUIT HAVING LENGTHENED CONNECTION PINS FOR CONNECTION TO EXTERNAL WIRINGS

BACKGROUND OF THE INVENTION

FIELD OF THE INVENTION

The present invention relates to a gate array type semiconductor integrated circuit.

FIG. 17 is a plan view showing a basic cell structure of a prior art gate array type semiconductor integrated circuit. As shown in FIG. 17, each of basic cells 1 is comprised of a pair of transistors, a PMOS transistor TP and an NMOS transistor TN.

The PMOS transistor TP is made by forming a PMOS transistor gate 12 on a P+ diffusion layer 17 while the NMOS transistor TN is made by forming an NMOS transistor gate 13 on an N+ diffusion layer 18. The PMOS transistor gate 12 and the NMOS transistor gate 13 are electrically connected to each other by a connection pin 15. Reference numerals 11, 14 and 16 designate a power source, a ground and an insulating oxide film, respectively.

FIG. 18 is a sectional view taken along the line II—II of FIG. 17. As shown in FIG. 18, the PMOS transistor gate 12 is selectively formed on a semiconductor substrate 51, and an insulating film 53 is formed on the PMOS transistor gate 12 except for part of it. Then, the connection pin 15 is formed covering part of the insulating film 53 and the PMOS transistor gate 12 on which no portion of the insulating film 53 lies.

Then, as shown in FIG. 19, the basic cells 1 are arranged in cell alignments 3 on a chip 5 and the cell alignments 3 are arranged in array with wiring regions 31 defined between adjacent ones of the cell alignments 3 to constitute a gate array type semiconductor integrated circuit. Reference numeral 6 designates input/output buffers, and reference numeral 7 designates bonding pads.

Also, as shown in FIG. 20, a dense array of the basic cells 1 on the chip 5 constitute a gate array type semiconductor integrated circuit. In such a case, part of the basic cells 1 are used as wiring regions.

A combination of several of the basic cells 1 can constitute a macro cell having a predetermined logic function. For example, an NAND gate 10 receiving signals on input terminals A, B and C as shown in FIG. 21 consists of three PMOS transistors T1 to T3 and three NMOS transistors T4 to T6, as shown in FIG. 22.

Thus, as shown in FIG. 23, via-holes (marked with "x" in FIG. 23) are provided in predetermined points, and wiring L1 is provided between the basic cells 1, so that the NAND gate 10 shown in FIG. 21 working as a macro cell 2 can be implemented.

A length of exemplary one of the basic cells 1 shown in FIG. 17 is equal to one-wiring pitch W1 determined by a minimum wiring interval in the semiconductor manufacturing technology. In this way, as shown in FIG. 24, the basic cells 1 are arranged in row to constitute the cell alignments 3. Thus, intervals between adjacent ones of connection pins 15 in any of the cell alignments 3 are also all equal to the single wiring pitch W1. The connection pins 15 of the basic cells 1 in any of the cell alignments 3 and their respective counterparts of the basic cells 1 in the adjacent cell alignment, opposed to each other, all lie in the same X coordinates, assuming herein that the cells are aligned in X-direction.

Adjacent ones of the cell alignments 3 define the wiring regions 31, and external wirings are provided between the separate basic cells 1, especially between the basic cells 1 in the separate cell alignments 3 by providing wirings in the wiring regions 31. The external wirings provided in the wiring regions 31 are usually of dual-layer system where one layer is used for lateral wiring (wiring in the X-direction) while the other layer is used for longitudinal wiring (wiring in Y-direction perpendicular to the X-direction). Electrical connection of the lateral wiring with the longitudinal wiring is established by forming via-holes in positions where both the wirings overlap with each other. For wiring layers where the wirings are provided, metal layers of aluminum, gold or the like are often used, and polysilicon layers may be used.

In the prior art gate array, the basic cells 1 are configured and arranged in the afore-mentioned manner, and the lateral wiring and longitudinal wiring are provided in the wiring regions 31 for connections between the basic cells 1 formed in the separate cell alignments 3.

Thus, there arises the problem that relative positions in wiring patterns of the lateral and longitudinal wirings are restricted (referred to as "wiring restrictions" hereinafter).

For example, as shown in FIG. 25, in case where first wiring electrically connecting a basic cell 1A in a cell alignment 3A and a basic cell 1C in a cell alignment 3B and second wiring electrically connecting a basic cell 1B in the cell alignment 3A and a basic cell 1D in the cell alignment 3B are to be formed in the wiring region 31 defined between the cell alignments, longitudinal wiring 42A, lateral wiring 41A and longitudinal wiring 42C are used for the first wiring while a longitudinal wiring 42B, lateral wiring 41B and longitudinal wiring 42D are used for the second wiring.

In this case, since the basic cells 1C and 1D respectively take positions one cell aside from counterparts of the basic cells 1A and 1B in the X-direction, a wiring restriction that the lateral wiring 41A in the first wiring should be positioned lower than the lateral wiring 41B in the second wiring in the Y-direction is imposed.

Additionally, as shown in FIG. 26, in case where cross wiring is to be provided, that is, first wiring electrically connecting a basic cell 1A in a cell alignment 3A and a basic cell 1D in a cell alignment 3B and second wiring electrically connecting a basic cell 1B in the cell alignment 3A and a basic cell 1C in the cell alignment 3B are to be formed, an illogical wiring restriction that lateral wiring 41A in the first wiring should be formed at once upper and lower than the lateral wiring 41B in the second wiring in the Y-direction is imposed, and thus, there arises the problem that the first and second wiring cannot be appropriately formed in the wiring region 31.

For that reason, it is needed that the lateral wiring of one of the first and second wirings be divided in connecting the associated cells, or that a bypass wiring be formed by using other wiring regions.

Because of the wiring restrictions as mentioned above, the external wiring between the basic cells 1 becomes more complicated as numerous numbers of the basic cells 1 are used for logic circuits to be constructed in the prior art gate array type semiconductor integrated circuit, and there arises the problem that a tremendously long processing time is required to provide the external wiring so as to satisfy the wiring restrictions even with automatic designing by a computer. Worst of all, wiring is impossible.

SUMMARY OF THE INVENTION

In a semiconductor integrated circuit having a plurality of cell alignments, each of which is comprised of a plurality of basic cells arranged in row in a first direction, the plurality of cell alignments being arranged in a second direction perpendicular to the first direction, the improvement is characterized in that a length along the first direction of each of connection pins for external connection in the basic cells is not less than one-wiring pitch which is determined by a minimum wiring interval with respect to external wirings between the basic cells, and a distance along the first direction between the connection pins of adjacent ones of the basic cells in each of the cell alignments is not less than one-wiring pitch.

Preferably, the semiconductor integrated circuit further comprises at least one wiring region, where the external wirings are to be formed, provided between two of the cell alignments adjacent to each other.

Preferably, the wiring region is formed between any adjacent ones of the cell alignments.

Preferably, the cell alignments are sequentially formed in the second direction without space.

Preferably, the length of each of the connection pins is the one-wiring pitch while the distance between the connection pins is the one-wiring pitch.

Preferably, each of the basic cells has a CMOS structure comprised of an NMOS transistor and a PMOS transistor, a gate of the NMOS transistor and a gate of the PMOS transistor being electrically connected by a specified internal wiring; and each of the connection pins is formed on at least one of the gates of the NMOS transistor and PMOS transistor.

Preferably, the one-wiring pitch is determined by a minimum wiring interval to which a thickness of each of the external wirings is added, the length along the second direction of each of the connection pins is determined as a half of the length of each of the external wirings.

Preferably, internal wirings are provided among the basic cells in the same cell alignment so as to constitute a macro cell having a predetermined logic function.

Preferably, each of the basic cells has a CMOS structure comprised of an NMOS transistor and a PMOS transistor, a gate of the NMOS transistor and a gate of the PMOS transistor being electrically connected by a specified internal wiring; and each of the connection pins is formed on the predetermined internal wiring.

Preferably, the length of each of the connection pins is twice as long as the one-wiring pitch, namely, two-wiring pitch, while the distance between the connection pins is the one-wiring pitch.

Preferably, the cell alignments include first, second and third cell alignments sequentially formed in the second direction without space.

Accordingly, it is an object of the present invention to obtain a gate array type semiconductor integrated circuit device in which wiring restrictions imposed thereon are relaxed and wirings between basic cells can be provided relatively easily.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

<First Preferred Embodiment>

Figure 1:
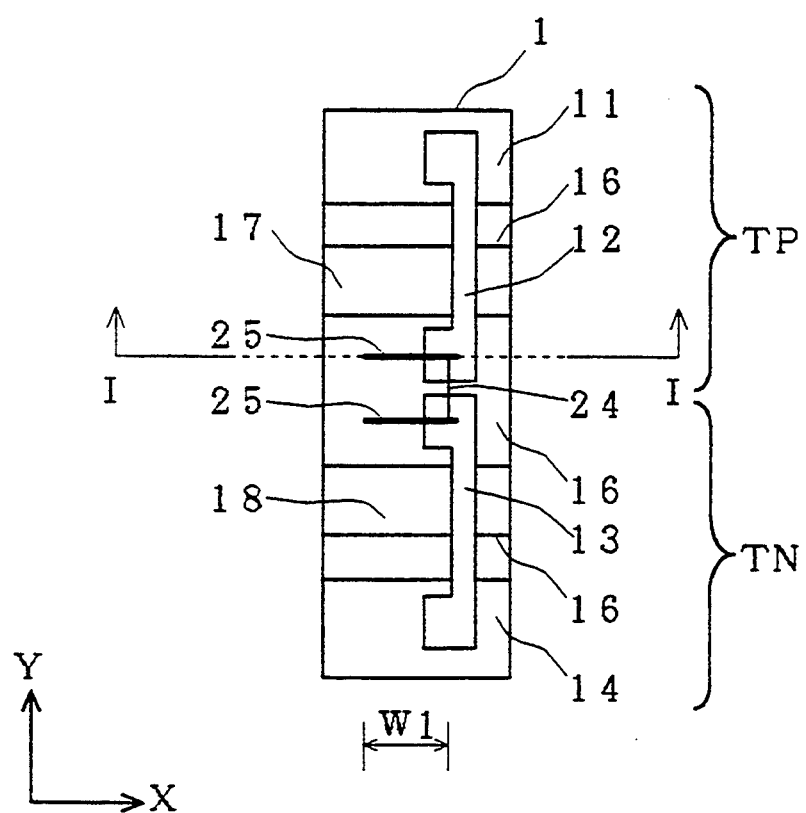
FIG. 1 is a plan view showing a configuration of a basic cell of a gate array type semiconductor integrated circuit in accordance with a first preferred embodiment of the present invention.

FIG. 1 is a plan view showing a structure of exemplary one of basic cells of a gate array type semiconductor integrated circuit in accordance with a first preferred embodiment of the present invention. As shown in FIG. 1, each of basic cells 1 consists of a pair of transistors, a PMOS transistor TP and an NMOS transistor TN.

The PMOS transistor TP is made by forming a PMOS transistor gate 12 on a P+ diffusion layer 17 while the NMOS transistor TN is made by forming an NMOS transistor gate 13 on an N+ diffusion layer 18.

The PMOS transistor gate 12 and the NMOS transistor gate 13 are electrically connected by gate wiring 24, and connection pins 25 each having a lateral length (a length in X-direction of FIG. 1) of one-wiring pitch W1 are provided on top of the PMOS transistor gate 12 and that of the NMOS transistor gate 13. Reference numerals 11, 14 and 16 respectively designate a power source, a GND and an insulating oxide film.

Figure 2:
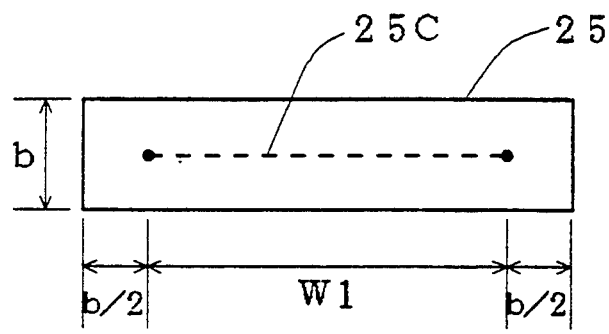
FIG. 2 is a plan view showing details of a connection pin related to FIG. 1.

FIG. 2 is a plan view illustrating details of a plain configuration of an example of the connection pins 25 shown in FIG. 1. As shown in FIG. 2, a longitudinal length (a length in Y-direction in FIG. 1) of each of the connection pins 25 equals a thickness "b" of metal wiring while its lateral length is precisely that which equals the one-wiring pitch W1 extended by b/2 from its opposite terminals to both the left and right.

Figure 3:
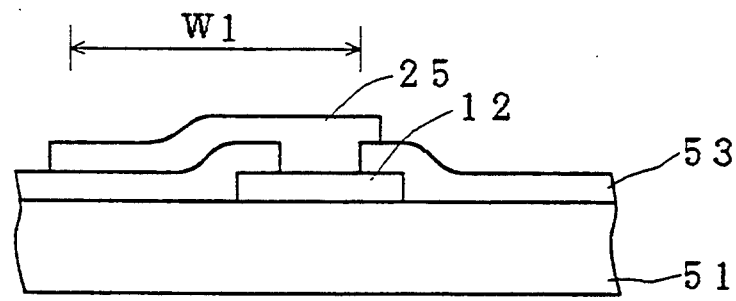
FIG. 3 is a sectional view taken along the line I—I of FIG. 1.

FIG. 3 is a sectional view taken along the line I—I of FIG. 1. As shown in FIG. 3, the PMOS transistor gate 12 is selectively formed on a semiconductor substrate 51, and an insulating film 53 is formed over the entire surface except for part of the PMOS transistor gate 12. Moreover, the connection pin 25 is formed, lying on the PMOS transistor gate 12 and onto the insulating film 53.

Although, as previously mentioned, the actual lateral length of each of the connection pins 25 is (W1+b), for convenience in the description below, the one-wiring pitch W1 shall be defined as a length determined by a minimum wiring interval in the semiconductor manufacturing technology allowing for a thickness of metal wiring. In addition to that, since external wiring may be formed in one of the connection pins 25 formed on the PMOS transistor gate 12 and on the NMOS transistor gate 13, only one connection pin, namely the representative connection pin 25 alone, for any of the basic cells 1 will be shown in the drawings referred to hereinafter.

Figure 19:
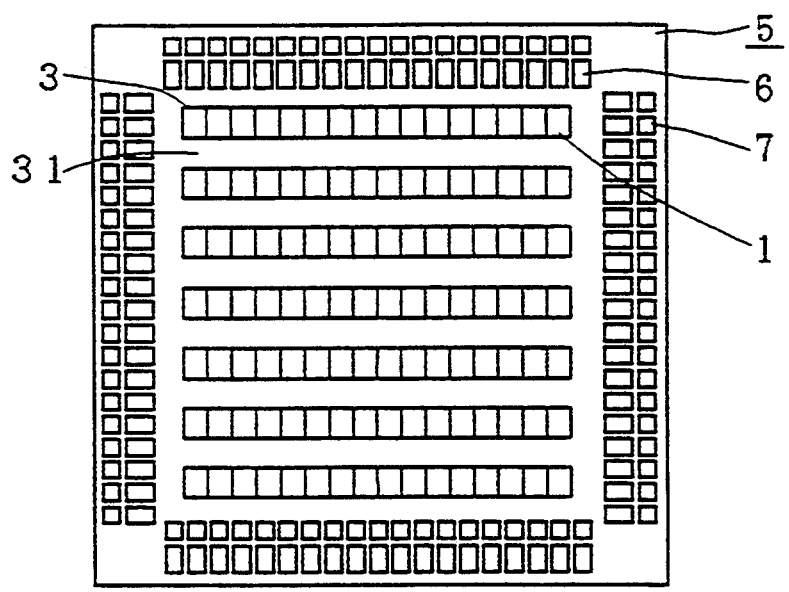
FIG. 19 is a plan view showing the entire configuration of a gate array type semiconductor integrated circuit.

Then, similar to the prior art embodiment, basic cells 1 are arranged in row on a chip 5 to constitute cell alignments 3 as shown in FIG. 19, and the cell alignments are arranged with wiring regions 31 defined between adjacent ones of the cell alignments to constitute a gate array type semiconductor integrated circuit.

Figure 20:
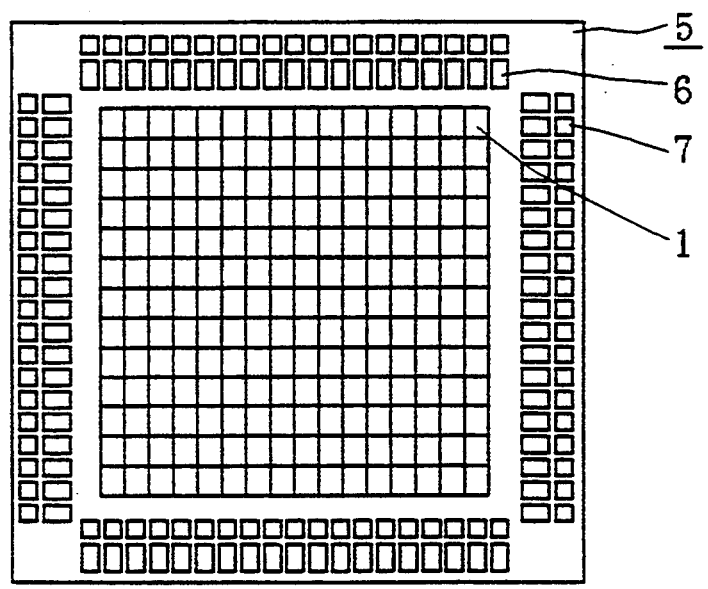
FIG. 20 is a plan view showing the entire configuration of a gate array type semiconductor integrated circuit.

Also, similar to the prior art embodiment, the basic cells 1 are closely arranged in a dense array on the chip 5 as shown in FIG. 20 to constitute a gate array type semiconductor integrated circuit. In such a case, part of the basic cells 1 are used as wiring regions.

Figure 4:
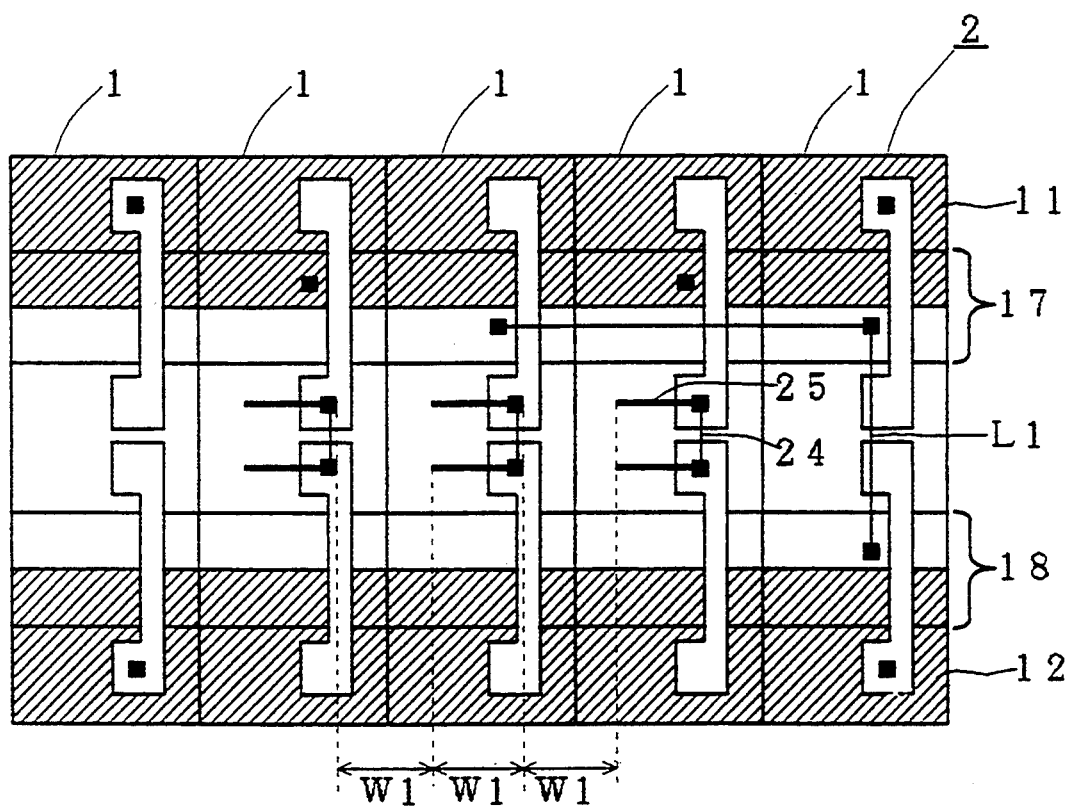
FIG. 4 is a plan view showing a configuration of a macro cell of the semiconductor integrated circuit in the first preferred embodiment.
Figure 21:
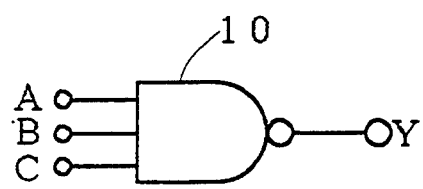
FIG. 21 is a circuit diagram showing an NAND gate.
Figure 22:
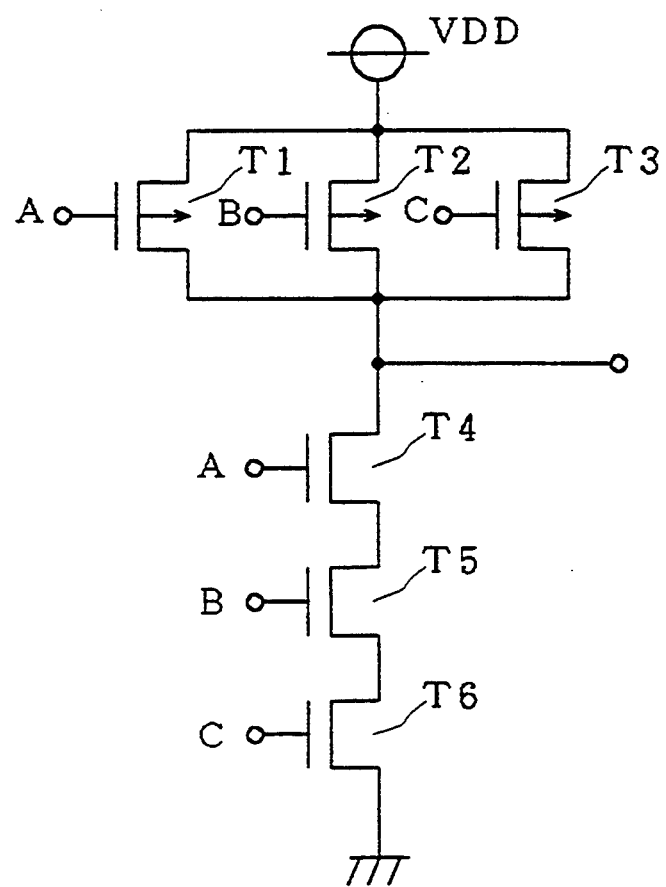
FIG. 22 is a circuit diagram showing an exemplary configuration of the NAND gate comprised of MOS transistors.
Figure 23:
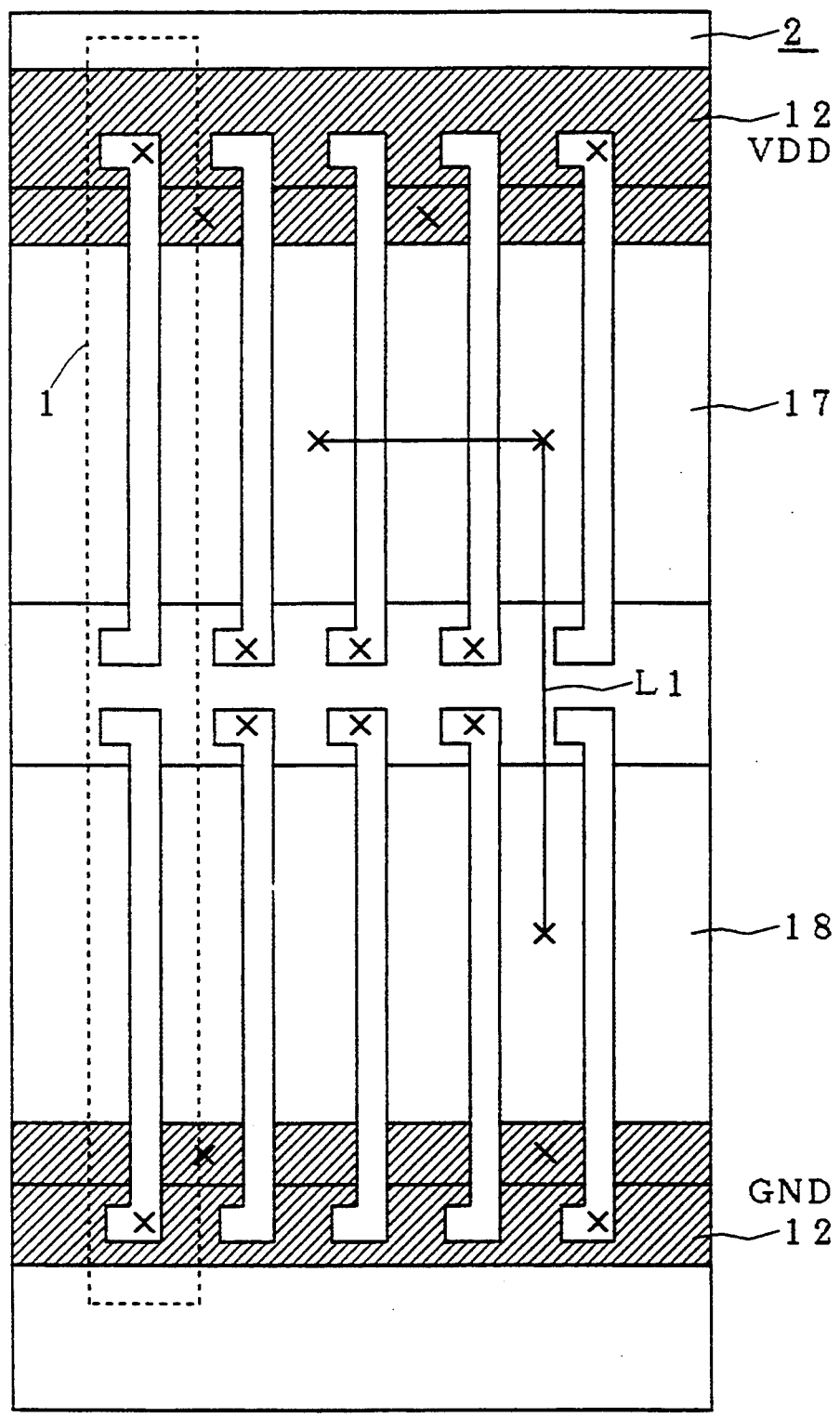
FIG. 23 is a plan view showing an exemplary configuration of the NAND gate in the gate array type semiconductor integrated circuit.
Figure 24:
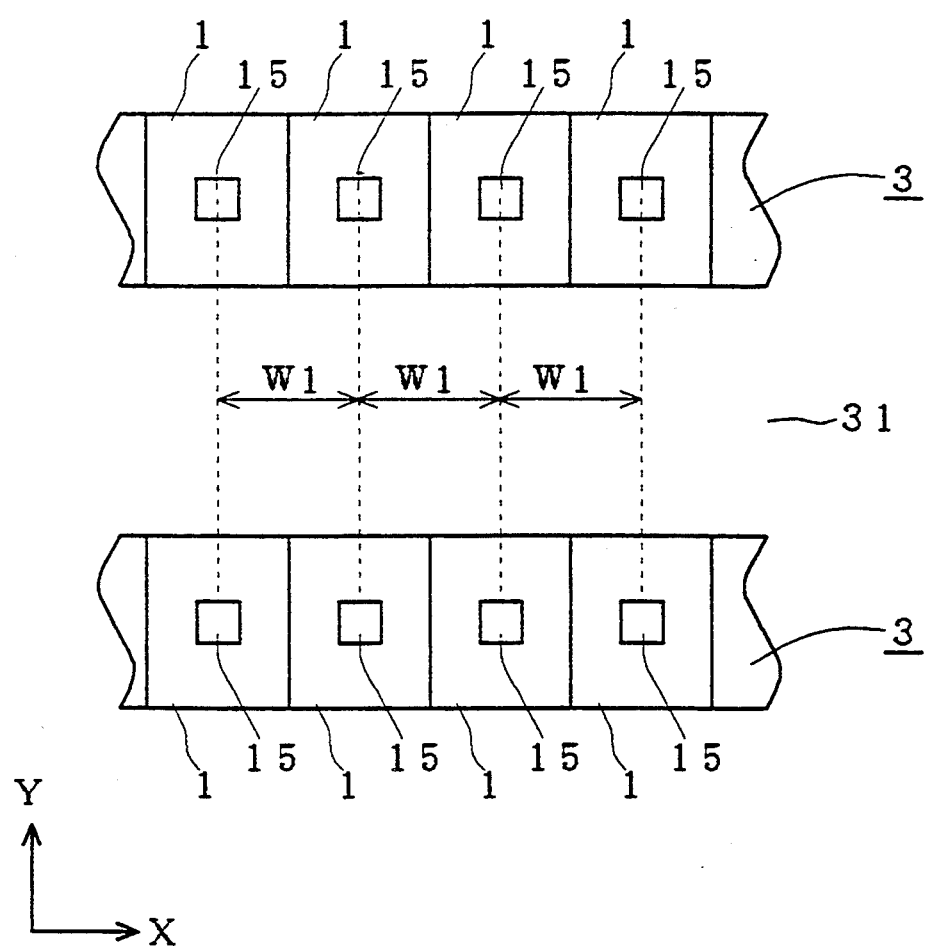
FIG. 24 is a plan view illustrating arrangements of cell alignments in a prior art gate array type semiconductor integrated circuit.
Figure 25:
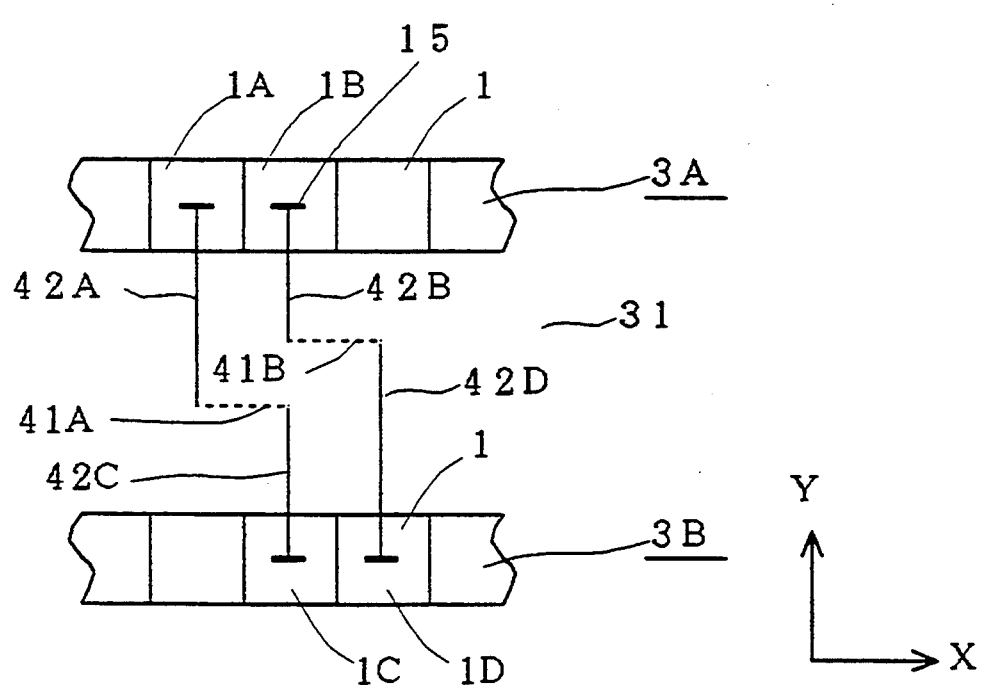
FIG. 25 is a plan view illustrating a disadvantage in the prior art.
Figure 26:
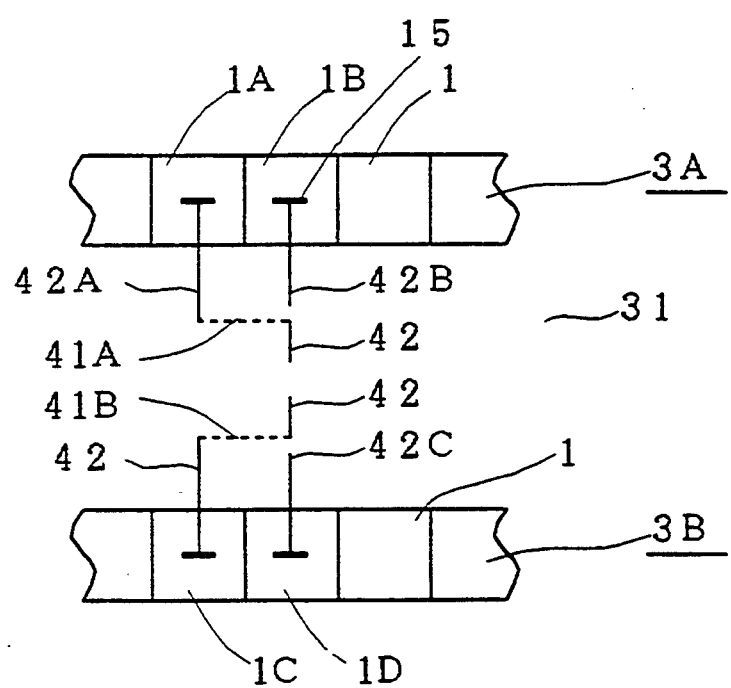
FIG. 26 is a plan view illustrating another disadvantage in the prior art.

FIG. 4 is a plan view showing a macro cell consisting of the basic cells 1 shown in FIG. 1. As shown in FIG. 4, the basic cells 1 are arranged in row to constitute a cell alignment, and via-holes (marked with blackened squares in FIG. 4) are provided in predetermined locations in the cell alignment and wiring L1 is provided among the basic cells to construct an NAND gate 10 of FIG. 21 in a macro cell 2.

Figure 5:
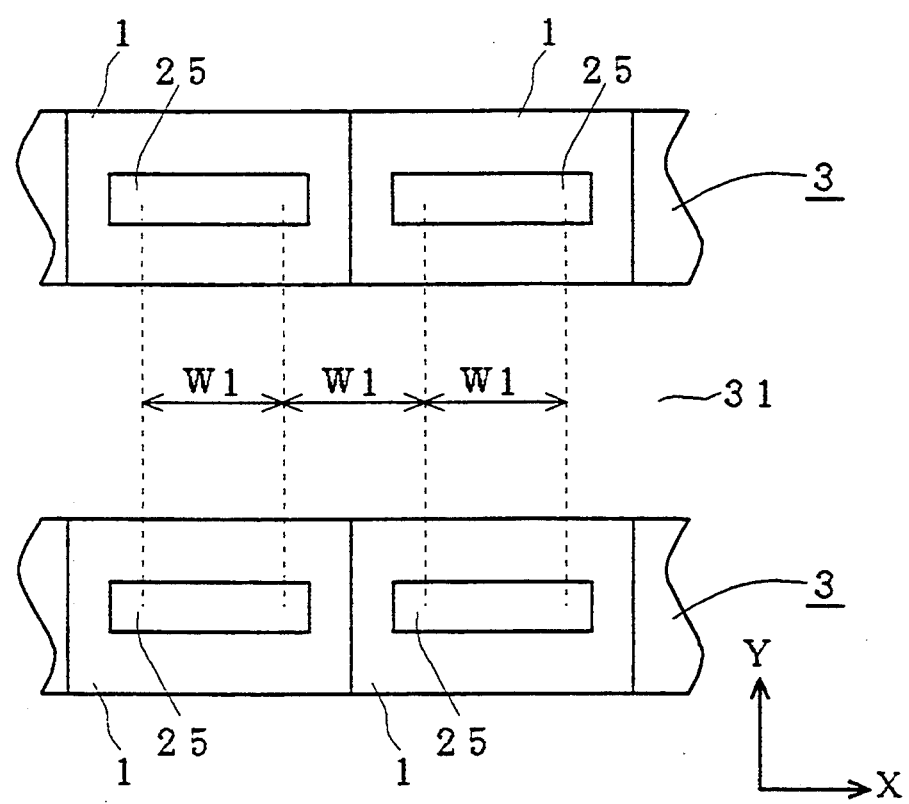
FIG. 5 is a plan view showing an arrangement of cell alignments in the first preferred embodiment.

As shown in FIG. 5, the basic cells 1 are arranged in row to constitute the cell alignments 3, and a distance in X-direction (a direction along each of the cell alignments 3) between the connection pins 25 of adjacent ones of the basic cells 1 in each of the cell alignments 3 is determined as the one-wiring pitch W1.

Then, the connection pins 25 in any of the cell alignments 3 and their respective counterparts in the adjacent cell alignment, opposed to each other, are positioned in the same X coordinates. Regions defined between the cell alignments 3 opposed to each other are the wiring regions 31, and wiring is provided in the wiring regions 31 to provide external wiring between the separate basic cells 1, especially between the basic cells 1 in the separate cell alignments 3. For the external wiring provided in the wiring regions 31, usually dual layer wiring is employed where lateral wiring (wiring in the X-direction) is provided in one layer or a first layer while longitudinal wiring (wiring in Y-direction perpendicular to the X-direction) is provided in the other layer or a second layer. Electrical connection of the lateral wiring to the longitudinal wiring is established by forming via-holes in areas where both the wirings overlap with each other. Wring layers used to provide the wirings are often made of metal such as aluminum, gold and the like, and sometimes they are made of polysilicon. The connection pins 25 are formed in the first layer.

In the previous first preferred embodiment, as has been described, the gate array type semiconductor integrated circuit is designed in such a way that the lateral length of the connection pin 25 of each of the basic cells 1 is determined as the one-wiring pitch W1 while the distance between the connection pins 25 of adjacent ones of the basic cells in any of the cell alignments 3 is determined as the one-wiring pitch W1.

Thus, since two longitudinal wirings can be formed from opposite terminals of each of the connection pins 25 in the Y-direction in the semiconductor integrated circuit of the first preferred embodiment, wiring restrictions which restrain relative positions in wiring patterns of lateral and longitudinal wirings in the wiring regions 31 can be greatly eased, compared with the prior art embodiment.

Figure 6:
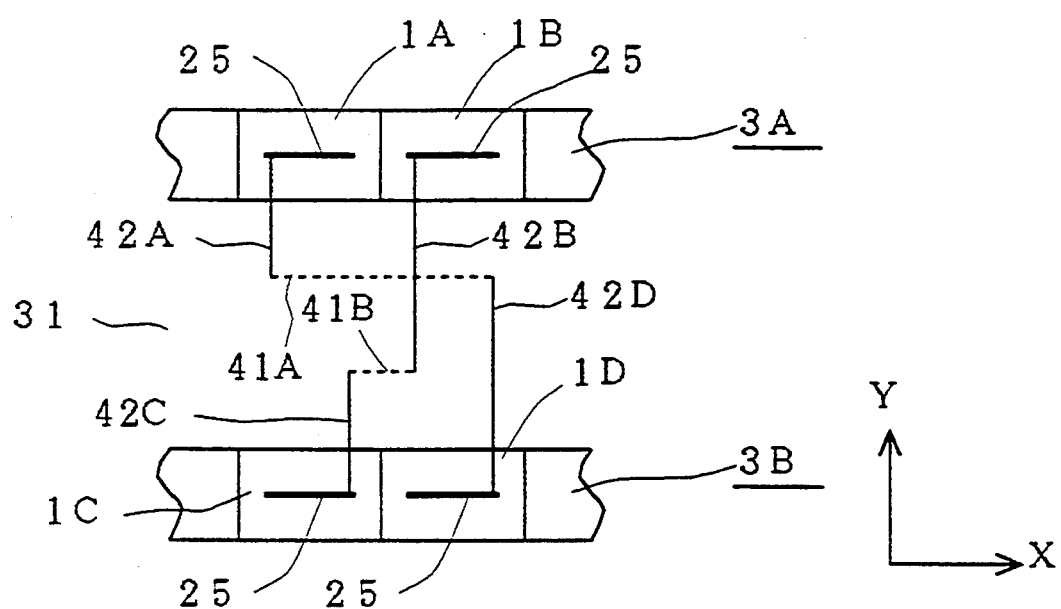
FIG. 6 is a plan view illustrating effects of the first preferred embodiment.

As shown in FIG. 6, for example, discussed below will be a case where two external wirings intersecting with each other, namely first wiring electrically connecting a basic cell 1A in a cell alignment 3A and a basic cell 1D in a cell alignment 3B and second wiring electrically connecting a basic cell 1B in the cell alignment 3A and a basic cell 1C in the cell alignment 3B, are to be provided.

In such a case, the external wirings are formed by providing a longitudinal wiring 42A extending from the left terminal of the connection pin 25 in the basic cell 1A, a longitudinal wiring 42B extending from the left terminal of the connection pin 25 in the basic cell 1B, a longitudinal wiring 42C extending from the right terminal of the connection pin 25 in the basic cell 1C, and a longitudinal wiring 42D extending from the right terminal of the connection pin 25 of the basic cell 1D, and further forming a lateral wiring 41A and a lateral wiring 41B of which Y coordinates are not coincident with each other to connect the longitudinal wiring 42A with the longitudinal wiring 42D, and the longitudinal wiring 42B with the longitudinal wiring 42C, respectively.

In this situation, there is no restriction that restraints which of the lateral wiring 41A and the lateral wiring 41B must be upper or lower than the other in the Y-direction; rather the two lateral wirings can be freely formed unless their Y coordinates are coincident with each other, and thus, utterly no wiring restriction is imposed.

Figure 7:
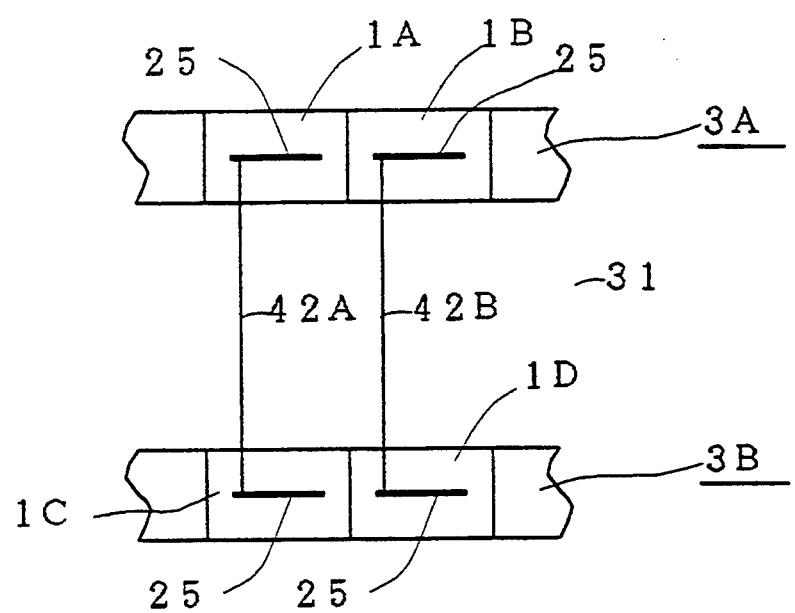
FIG. 7 is a plan view illustrating effects of the first preferred embodiment.

As will be recognized, when a first wiring connecting the basic cell 1A in the cell alignment 3A and the basic cell 1C in the cell alignment 3B and a second wiring connecting the basic 1B in the cell alignment 3A and the basic cell 1D in the cell alignment 3B are provided, the external wirings can be formed by providing the longitudinal wiring 42A extending from the left terminal of the connection pin 25 in the basic cell 1A to the left terminal of the connection pin 25 in the basic cell 1C and the longitudinal wiring 42B extending from the left terminal of the connection pin 25 in the basic cell 1B to the left terminal of the connection pin 25 in the basic cell 1D, as shown in FIG. 7.

Figure 8:
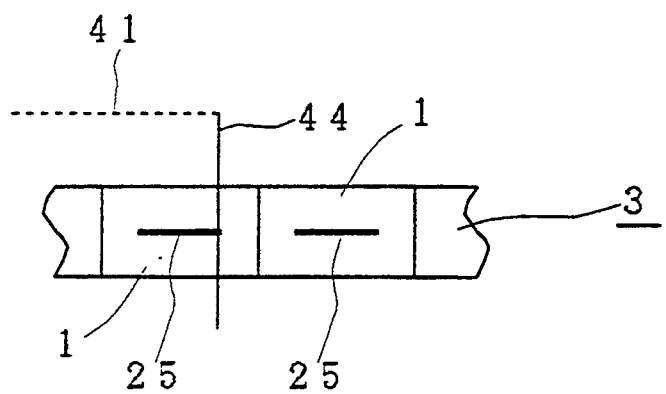
FIG. 8 is a plan view illustrating effects of the first preferred embodiment.
Figure 9:
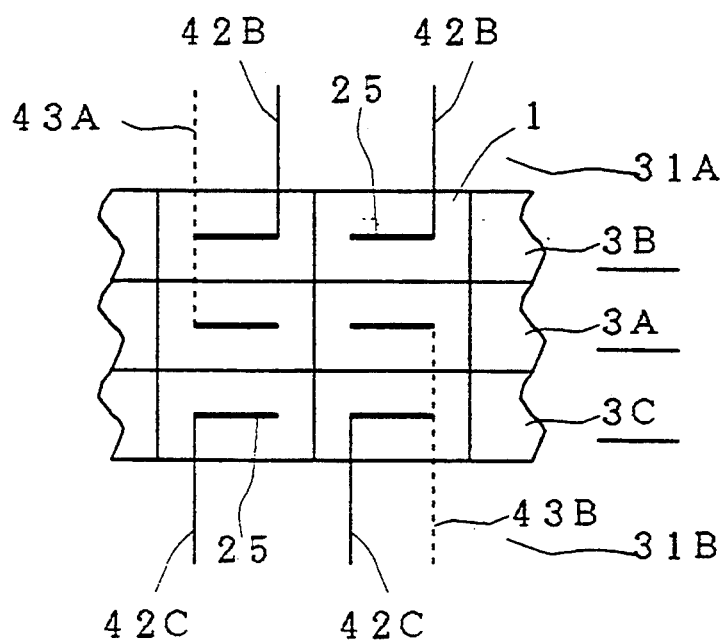
FIG. 9 is a plan view illustrating effects of the first preferred embodiment.

In this situation, a longitudinal wiring 44 is formed in the second layer while the connection pins 25 are formed in the first layer, and therefore, as shown in FIG. 8, another longitudinal wiring 44 can traverse the right terminal of the connection pin 25 not used for connection.

Also in case where the cell alignments 3B, 3A and 3C are sequentially formed without the wiring regions 31 interposed between adjacent ones of these cell alignments, longitudinal wiring 43A extending from the connection pin 25 in the cell alignment 3A can be provided in a wiring region 31A, traversing the cell alignment 3B without overlapping with the longitudinal wiring 42B in the cell alignment 3B, and also a longitudinal wiring 43B extending from the connection pin 25 in the cell alignment 3A can be formed in a wiring region 31B, traversing the cell alignment 3C without overlapping with the longitudinal wiring 42C in the cell alignment 3C.

As has been described, in the semiconductor integrated circuit of the first preferred embodiment, since two separate longitudinal wirings can be provided extending from each of the basic cells 1, the longitudinal wiring of the basic cell 1 in one of the cell alignments 3 and that of the basic cell 1 in the other of the cell alignments 3 in the wiring region 31 between the cell alignments 3 opposed to each other are provided with one-wiring pitch W1 shifted from each other to make it utterly impossible that there is electrical connection between those longitudinal wrings in both the cell alignments 3 even if Y coordinates of the longitudinal wirings overlap with each other.

As a result, forming lateral wiring electrically connecting desired longitudinal wirings so as not to overlap with any lateral wiring, wiring can be easily implemented without such disadvantage of complicatedness as in the prior art. Accordingly, a coefficient of utilization of the basic cells 1 in the semiconductor integrated circuit of the first preferred embodiment is greatly enhanced compared with the prior art embodiments.

Thus, since it becomes possible to provide wiring between the basic cells 1 according to a relatively easy algorithm, automatic design can be processed by a computer at high speed.

Since the number of lateral wirings to be provided in parallel with one another within each of the wiring regions 31 is coincide with an overlap frequency XN of the lateral wirings in the X-direction, the wiring regions 31 may be formed in a longitudinal length across which XN lateral wirings can be formed. In this way, the desirable longitudinal length for each of the wiring regions 31 can be easily found by calculating the overlap frequency XN of the lateral wirings.

As a lateral length of each of the connection pins 25 is increased, there is extra extension of a distance between the basic cells 1 which is to work as a transistor area; and therefore, possibility of breaking the wirings because of wiring level difference is reduced, and the yield in manufacturing process is enhanced.

Figure 10:
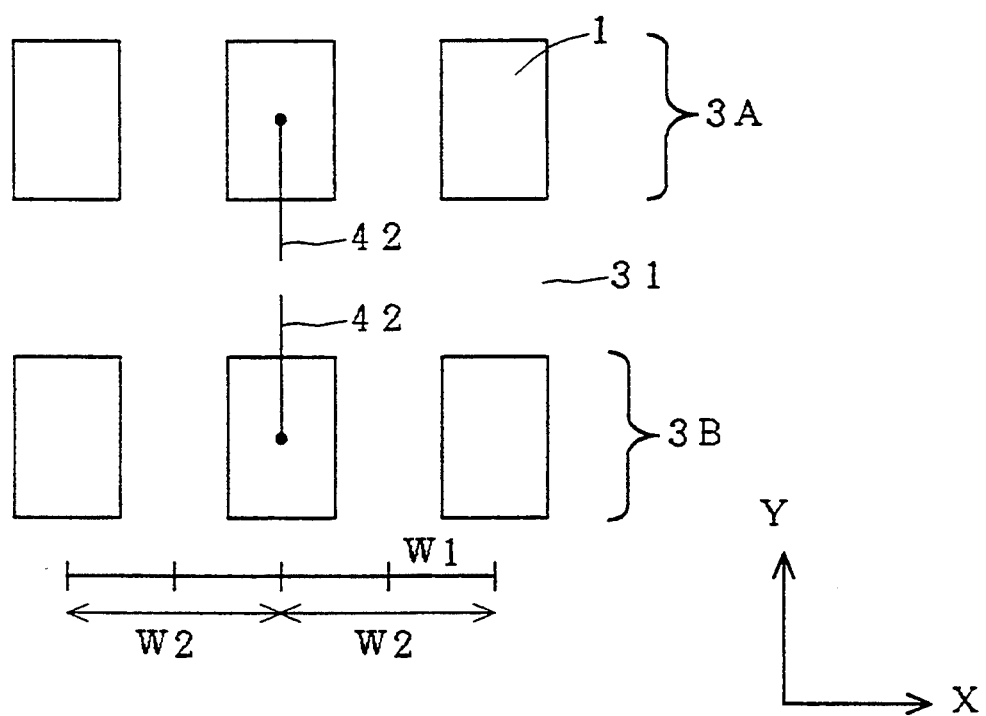
FIG. 10 is a plan view illustrating effects of the first preferred embodiment.
Figure 11:
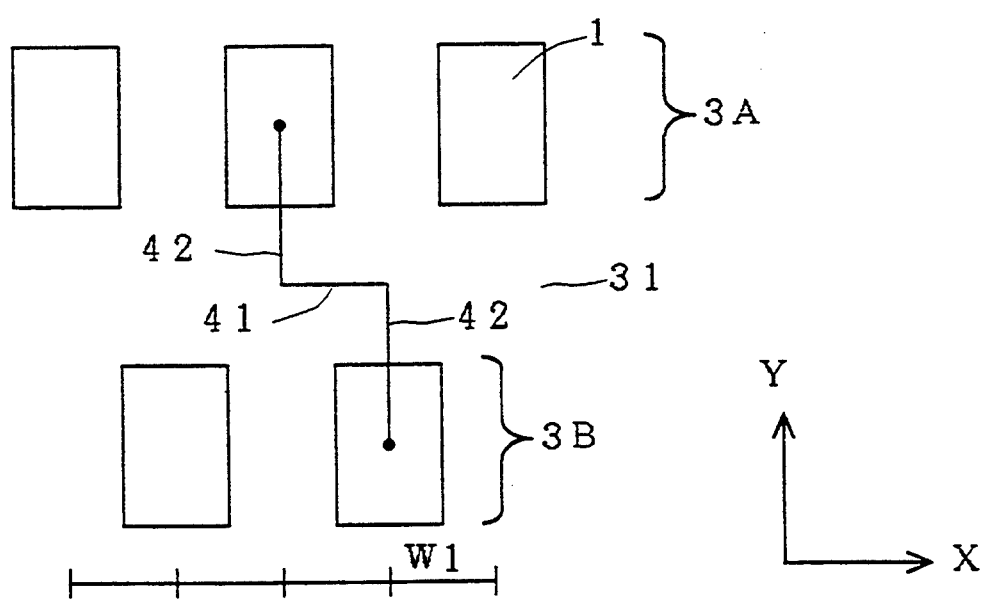
FIG. 11 is a plan view illustrating effects of the first preferred embodiment.
Figure 12:
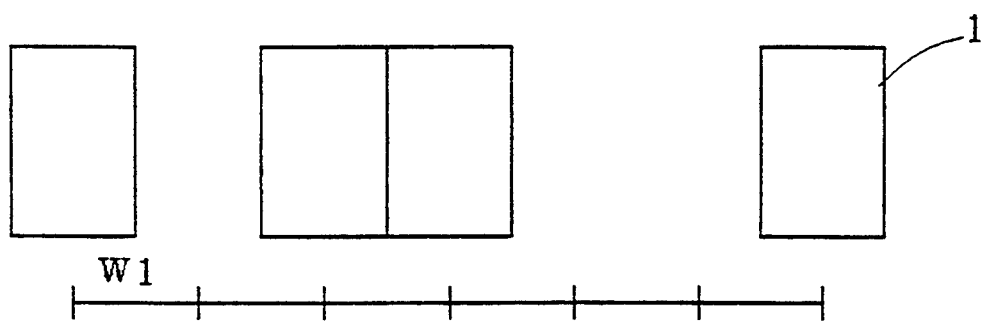
FIG. 12 is a plan view illustrating effects of the first preferred embodiment.

For more relaxation of the wiring restrictions upon the prior art semiconductor integrated circuit which is comprised of the basic cells 1 having the lateral length of the one-wiring pitch W1, examples as shown in FIGS. 10 to 12 will be presented.

FIG. 10 shows an arrangement where the distance between the adjacent basic cells 1 in one cell alignment equals two-wiring pitch W2. In such a case, however, one longitudinal wiring 42 can be formed extending from each of the basic cells 1, and since overlap of Y coordinates of the longitudinal wirings 42 of the basic cells 1 of the same X coordinate necessarily leads to electrical connection between the longitudinal wirings, there is no relaxation of the wiring restrictions as have existed in the prior art.

FIG. 11 depicts an arrangement where the distance between the adjacent basic cells 1 in one cell alignment equals two-wiring pitch W2 and the basic cells 1 in a cell alignment 3A and their respective counterparts in a cell alignment 3B which is opposed to the cell alignment 3A with the wiring region 31 interposed therebetween are located in skew positions from each other, one-wiring pitch W1 shifted from face-to-face positions in the X-direction. In such an arrangement, although the wiring restrictions can be relaxed to some extent, wiring paths are bent in providing any external wiring between the basic cells 1 in the cell alignment 3A and their respective counterparts in the cell alignment 3B, and hence, it is necessary to provide a lateral wiring 41. Thus, wiring patterns consisting of the longitudinal and lateral wirings become more complicated than required and the number of via-holes electrically connecting the longitudinal wirings and the lateral wirings is increased, and therefore, this example is not practical because of the degraded yield in providing wirings.

FIG. 12 illustrates an arrangement where intervals between the adjacent basic cells 1 are variable so as to make the wiring restrictions avoidable. Although the wiring restrictions can be relaxed to some extent with such an arrangement, this example is unfeasible because numerous kinds of macro cells are to be registered in the macro cell library.

As state above, in the prior art semiconductor integrated circuit which is comprised of the basic cells 1 each having a lateral length of one-wiring pitch W1, the wiring restrictions cannot be greatly relaxed in practice even with some improvement of the arrangement, unlike the semiconductor integrated circuit of the first preferred embodiment.

Although the connection pins 25 are formed on the PMOS transistor gate 12 and the NMOS transistor gate 13 in the above-mentioned first preferred embodiment, the connection pins 25 may be formed only on one of the gates 12 and 13.

<Second Preferred Embodiment>

Figure 13:
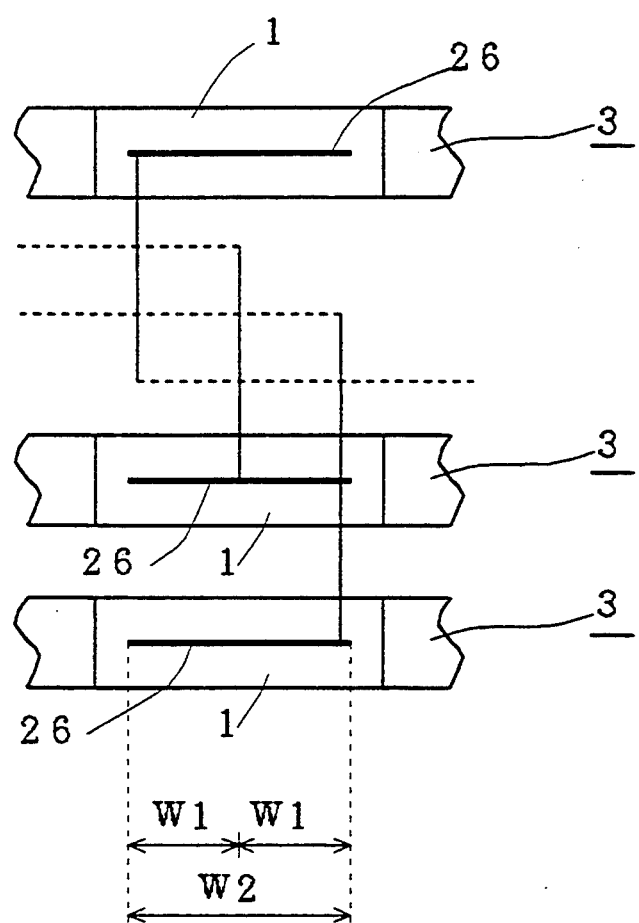
FIG. 13 is a plan view showing a structure of basic cells of a gate array type semiconductor integrated circuit of a second preferred embodiment according to the present invention.

FIG. 13 is a plan view showing a basic cell arrangement of a gate array type semiconductor integrated circuit of a second preferred embodiment according to the present invention. As shown in FIG. 13, a lateral length of a connection pin 26 in each of basic cells 1 is twice as long as one-wiring pitch W1, namely, two-wiring pitch W2.

A distance between the connection pins 26 in the adjacent basic cells 1 in each of cell alignments 3 equals the one-wiring pitch W1 as in the first preferred embodiment. Other parts are similar to corresponding ones described in conjunction with the first preferred embodiment, and therefore, description about them is omitted.

In this way, in the second preferred embodiment, the gate array type semiconductor integrated circuit is designed in the conditions that the lateral length of the connection pin 26 of each of the basic cells 1 is determined as two-wiring pitch W2 and that the distance between the connection pints 26 of the adjacent basic cells in any of the cell alignments 3 is determined as one-wiring pitch W1.

Figure 14:
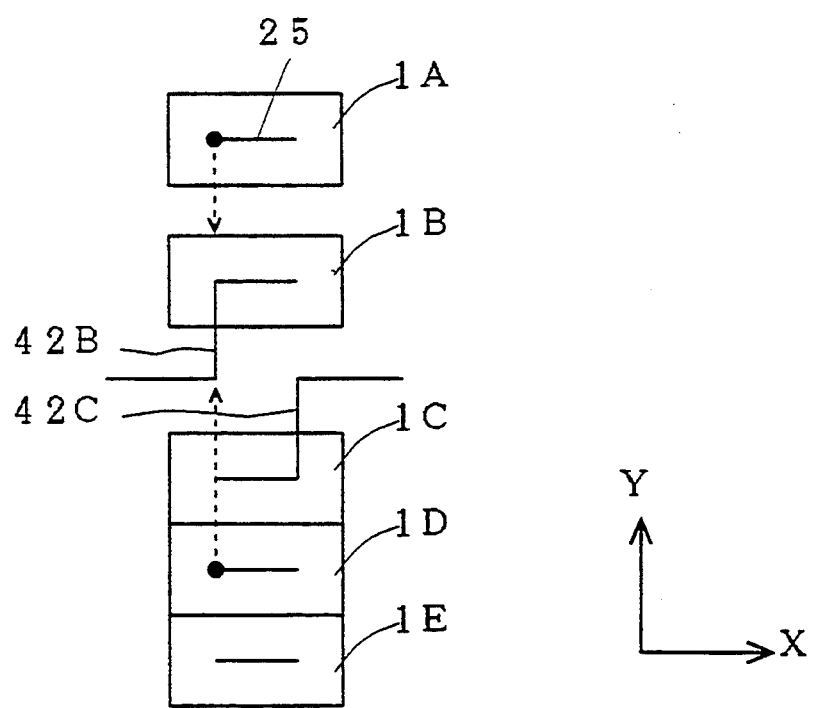
FIG. 14 is a plan view illustrating effects of the second preferred embodiment.

Thus, since three longitudinal wirings can be provided extending from opposite terminals of each of the connection pins 26 and from its center in the Y-direction in the semiconductor integrated circuit of the second preferred embodiment, the wiring restrictions can be greatly relaxed, a coefficient of utilization of the basic cells 1 can be enhanced, and the yield in the manufacturing process can be enhanced, as in the first preferred embodiment. In addition to that, the semiconductor integrated circuit of the second preferred embodiment is superior in relaxation of the wiring restrictions to that of the first preferred embodiment. As shown in FIG. 14, for example, under the conditions that basic cells 1A to 1E of the same X coordinate belong to separate cell alignments, respectively, and that the basic cells 1C to 1E are sequentially formed in the Y-direction, a case where wiring connecting the basic cell 1A and the basic cell 1D is to be provided will be discussed below.

In such a case, as shown in FIG. 14, it is impossible, as for the arrangement of the first preferred embodiment, that longitudinal wiring directly connecting the connection pin 25 in the basic cell 1A and the connection pin 25 in the basic cell 1D is provided if a longitudinal wiring 42B extends from the left terminal of the connection pin 25 in the basic cell 1B while a longitudinal wiring 42C extends from the right terminal of the connection pin 25 in the basic cell 1C.

Figure 15:
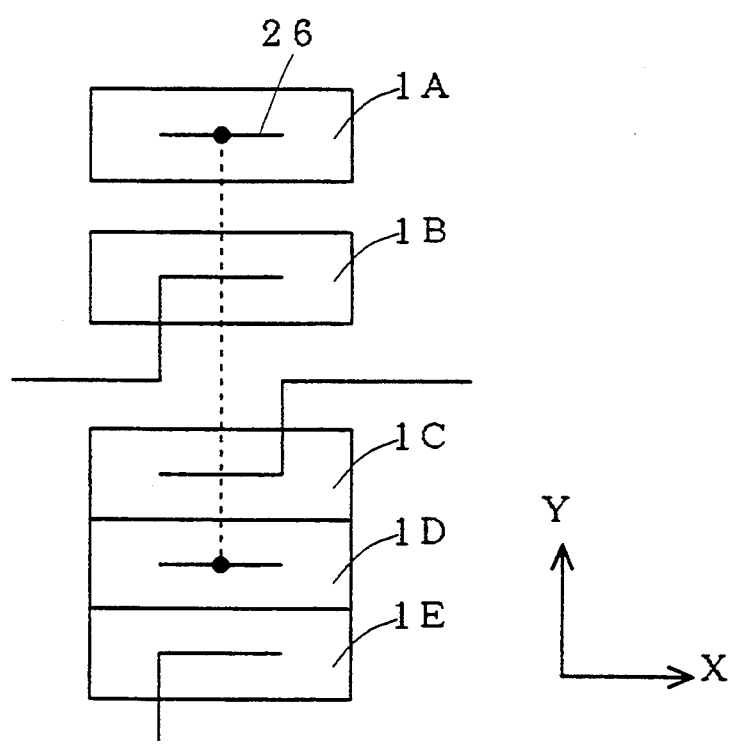
FIG. 15 is a plan view illustrating effects of the second preferred embodiment.

Another case similar to the above will be discussed in conjunction with the arrangement of the second preferred embodiment. In this case, as shown in FIG. 15, it is possible to provide a longitudinal wiring 42A directly connecting the center of the connection pin 26 in the basic cell 1A and the center of the connection pin 26 in the basic cell 1D even if the longitudinal wiring 42B extends from the left terminal of the connection pin 26 in the basic cell 1B while the longitudinal wiring 42C extends from the right terminal of the connection pin 26 in the basic cell 1C.

As mentioned above, in the semiconductor integrated circuit of the second preferred embodiment, the wiring restrictions can be more relaxed than the semiconductor integrated circuit of the first preferred embodiment.

<Third Preferred Embodiment>

Figure 16:
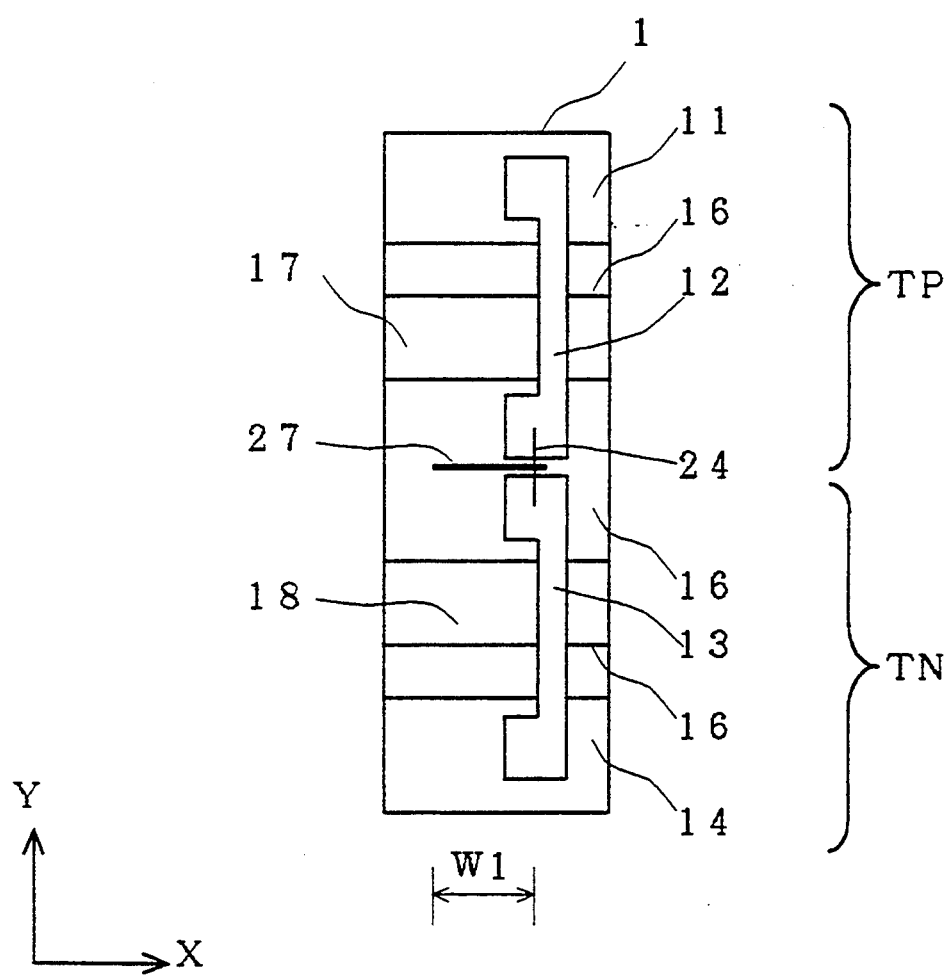
FIG. 16 is a plan view showing a configuration of a basic cell of a gate array type semiconductor integrated circuit according to the third preferred embodiment of the present invention.
Figure 17:
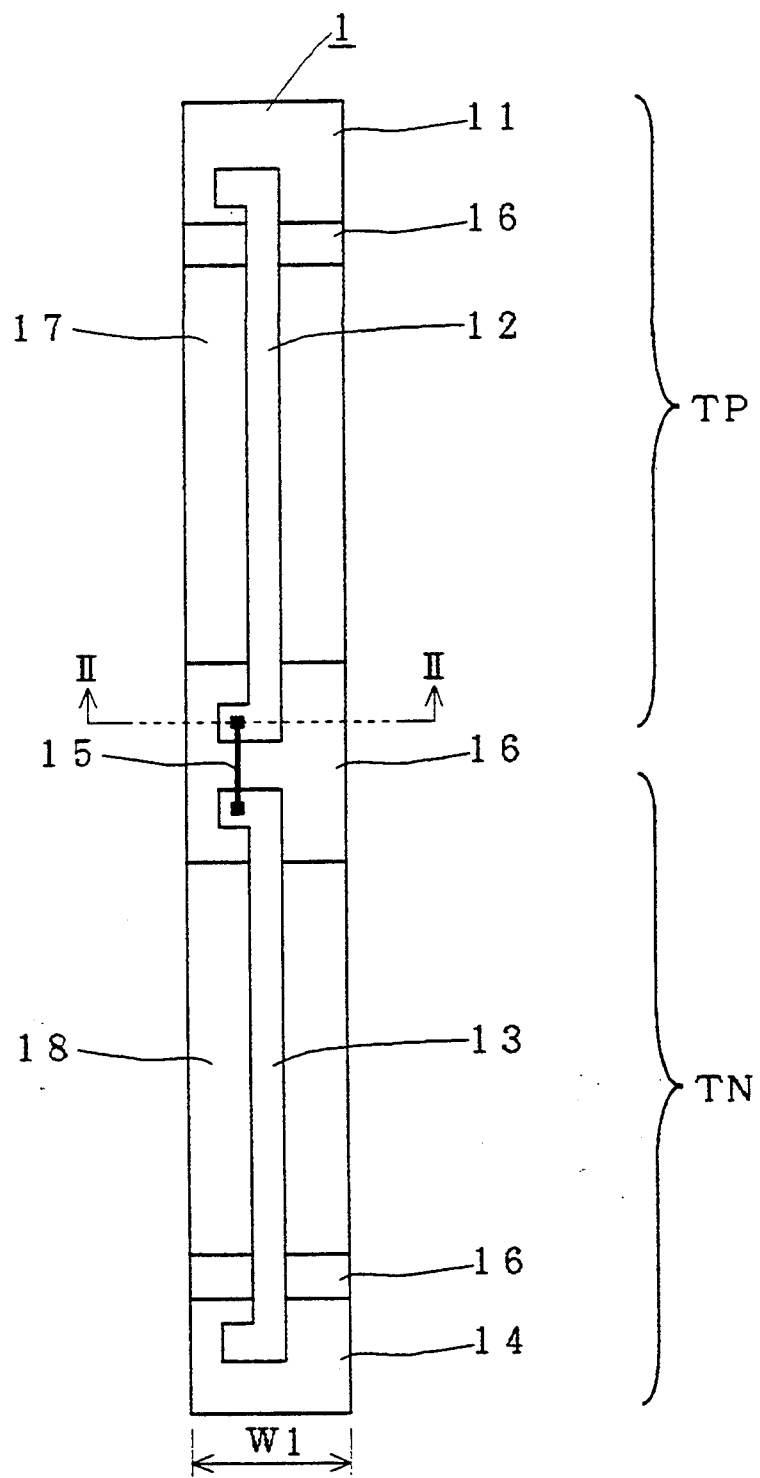
FIG. 17 is a plan view showing a configuration of a basic cell of a prior art gate array type semiconductor integrated circuit.
Figure 18:
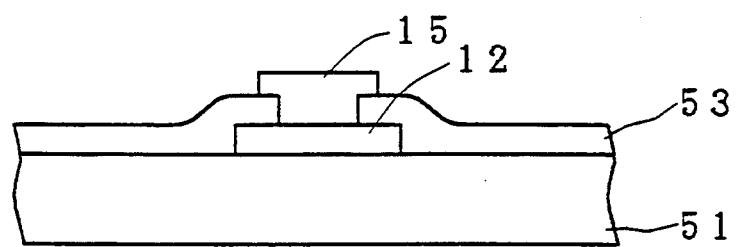
FIG. 18 is a sectional view taken along the line II—II of FIG. 17.

FIG. 16 is a plan view showing a basic cell arrangement of a gate array type semiconductor integrated circuit of a third preferred embodiment according to the present invention. As shown in FIG. 16, each of basic cells 1 consists of a pair of transistors, a PMOS transistor TP and an NMOS transistor TN.

The PMOS transistor TP is made by forming a PMOS transistor gate 12 on a P+ diffusion layer 17 while the NMOS transistor TN is made by forming an NMOS transistor gate 13 on an N+ diffusion layer 18.

The PMOS transistor gate 12 and the NMOS transistor gate 13 are electrically connected to each other by a gate wiring 24 interposed therebetween, and a connection pin 27 having a lateral length (a length in X-direction in FIG. 16) of one-wiring pitch W1 is provided on the gate wiring 24, electrically connected to the gate wiring 24. A distance between the connection pins 27 in adjacent ones of the basic cells 1 in each of cell alignments 3 is determined as one-wiring pitch W1. Other parts of this arrangement are similar to those in the first preferred embodiment, and therefore, description about them is omitted.

Since two longitudinal wirings can be provided extending from opposite terminals of each of the connection pins 27 in the Y-direction in the semiconductor integrated circuit of the third preferred embodiment having the above-mentioned arrangement as in the first preferred embodiment, a wiring restriction which restrains relative positions in wiring patterns applied to wiring regions 31 defined between adjacent ones of the cell alignments 3 can be greatly relaxed compared with the prior art embodiments, a coefficient of utilization of the basic cells 1 can be enhanced, and the yield in the manufacturing process can be also enhanced.

<Modifications>

Although, in the first and third preferred embodiments, the gate array type semiconductor integrated circuits are designed in the conditions that the lateral length of the connection pin 25 (27) in each of the basic cells 1 is determined as the one-wiring pitch W1 and that the distance between the connection pins 25 (27) of any adjacent basic cells in one of the cell alignments 3 is determined as the one-wiring pitch W1, while in the second preferred embodiment the gate array type semiconductor integrated circuit is designed in the conditions that the lateral length of the connection pin 26 in each of the basic cells 1 is determined as the two-wiring pitch W2 and that the distance between the connection pins 26 in any adjacent basic cells in any of the cell alignments 3 is determined as the one-wiring pitch W1. However the present invention is not restricted to the precise form in the previous statement and will be effective if satisfying requirements stated below.

The lateral length of the connection pin in each of the basic cells 1 may be determined as one-wiring pitch or over while the distance between the connection pins in adjacent ones of the basic cells 1 in any of the cell alignments 3 may be determined as the one-wiring pitch or over. This is because two or more longitudinal wirings can be formed extending from any connection pin in the basic cells 1 as external wirings.

However, it is desirable that the distance between the connection pins is determined as the one-wiring pitch W1 to minimize the degradation of integration of the semiconductor integrated circuits, and additionally, the lateral length of any connection pin is desirably determined as at most the two-wiring pitch W2 or so.

Although, as for the first to third preferred embodiments, the connection pins are formed in the first layer where the lateral wiring is provided, they may also be formed in any layer other than the first and second layers.

As has been described, in the semiconductor integrated circuit according to the present invention, a length along a first direction of a connection pin for external connection in each of basic cells is one-wiring pitch or over, which is determined by a minimum wiring interval of external wirings among the basic cells, and a distance along the first direction between the connection pins in adjacent ones of the basic cells in any of cell alignments is the one-wiring pitch or over.

Since two or more longitudinal wirings can be formed extending from the connection pin in each of the basic cells in a second direction, wiring restrictions upon connection pins in the separate basic cells can be greatly relaxed, and wiring among the basic cells can be relatively easily implemented.

While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit having a plurality of cell alignments, each of which is comprised of a plurality of basic cells arranged in row in a first direction, said plurality of cell alignments being arranged in a second direction perpendicular to said first direction; characterized in that a length along said first direction of each of connection pins for external connection in said basic cells is not less than one-wiring pitch which is a wiring-to-wiring distance of external wirings between said basic cells, said wiring-to-wiring distance being determined by a minimum wiring internal of said external wirings; and a distance along said first direction between said connection pins of adjacent ones of said basic cells in each of said cell alignments is not less than one-wiring pitch.

2. A semiconductor integrated circuit according to claim 1, further comprising:

at least one wiring region, where said external wirings are to be formed, provided between two of said cell alignments adjacent to each other.

3. A semiconductor integrated circuit according to claim 2, wherein said wiring region is formed between any adjacent ones of said cell alignments.

4. A semiconductor integrated circuit according to claim 1, wherein said cell alignments are sequentially formed in said second direction without a wiring region between the cells.

5. A semiconductor integrated circuit according to claim 1, wherein said length of each of said connection pins is said one-wiring pitch while said distance between said connection pins is said one-wiring pitch.

6. A semiconductor integrated circuit according to claim 5, wherein each of said basic cells has a CMOS structure comprised of an NMOS transistor and a PMOS transistor, a gate of said NMOS transistor and a gate of said PMOS transistor being electrically connected by a specified internal wiring; and each of said connection pins is formed on at least one of said gates of said NMOS transistor and PMOS transistor.

7. A semiconductor integrated circuit according to claim 1, wherein a length along said first direction of each of said connection pins is equal to a sum of said one-wiring pitch and a width of each of said external wirings, and a width along said second direction of each of said connection pins is equal to a width of each of said external wirings.

8. A semiconductor integrated circuit according to claim 7, wherein internal wirings are provided among said basic cells in said same cell alignment so as to constitute a macro cell having a predetermined logic function.

9. A semiconductor integrated circuit according to claim 5, wherein each of said basic cells has a CMOS structure comprised of an NMOS transistor and a PMOS transistor, a gate of said NMOS transistor and a gate of said PMOS transistor being electrically connected by a specified internal wiring; and each of said connection pins is formed on said predetermined internal wiring.

10. A semiconductor integrated circuit according to claim 1, wherein said length of each of said connection pins is twice as long as said one-wiring pitch, namely, two-wiring pitch, while said distance between said connection pins is said one-wiring pitch.

11. A semiconductor integrated circuit according to claim 10, wherein said cell alignments include first, second and third cell alignments sequentially formed in said second direction without a wiring region between the cells.

12. A semiconductor integrated circuit having a plurality of cell alignments, each of which is comprised of a plurality of basic cells arranged in row in a first direction, said plurality of cell alignments being arranged in a second direction perpendicular to said first direction; characterized in that a length along said first direction of each of said connection pins for external connection in said basic cells is not less than one-wiring pitch which is determined by a sum of a minimum wiring interval between external wirings between said basic cells and a width of said external wirings, and a distance along said first direction between said connection pins of adjacent ones of said basic cells in each of said cell alignments is not less than one-wiring pitch.

* * * * *